(12) United States Patent
Li

(10) Patent No.: US 6,228,661 B1
(45) Date of Patent: May 8, 2001

(54) METHOD TO DETERMINE THE DARK-TO-CLEAR EXPOSURE DOSE FOR THE SWING CURVE

(75) Inventor: Kam-tung Li, Taichung (TW)

(73) Assignee: Mosel Vitelic Inc., Hsinchu (TW)

( * ) Notice: Subject to any disclaimer, the term of this patent is extended or adjusted under 35 U.S.C. 154(b) by 0 days.

(21) Appl. No.: 09/559,960

(22) Filed: Apr. 27, 2000

(30) Foreign Application Priority Data

Feb. 15, 2000 (TW) .................................................. 89102659

(51) Int. Cl.⁷ .................................................. H01L 21/00
(52) U.S. Cl. .................. 438/8; 216/59; 216/84; 438/14; 438/689; 438/745
(58) Field of Search ............................. 438/8, 9, 14, 689, 438/719, 725, 745, 753; 216/59–61, 79, 84–86; 156/345 LC, 345 MT

(56) References Cited

U.S. PATENT DOCUMENTS 5,690,785 * 11/1997 Nakaya ..................................... 438/8
5,747,201 * 5/1998 Nakayama et al. .................. 438/8 X

* cited by examiner

*Primary Examiner*—William Powell
(74) *Attorney, Agent, or Firm*—Darby & Darby

(57) ABSTRACT

An object of the present invention is to provide a method for accurately determining a swing curve in the μm order's semiconductor technology. Photoresist films with different thicknesses are coated on silicon dummy wafers, respectively. Using a mask with a critical dimension bar's pattern, each of the chips of the silicon dummy wafers is exposed by different exposure doses such that the pattern is transferred on each of the chips. After the silicon dummy wafers are developed, each of the chips of the silicon dummy wafers is inspected by using a scanning electron microscope. For each of the silicon dummy wafers, the exposure dose resulting in completely removing the photoresist film on the region between the adjacent critical dimension bars of the pattern by developing is recorded. According to the present invention, it is easy to obtain an accurate swing curve since the resolution of the scanning electron microscope is up to the order of μm. The exposure dose corresponding to a peak point or valley point of the swing curve is chosen depending on the subsequent process of etching.

8 Claims, 3 Drawing Sheets

METHOD TO DETERMINE THE DARK-TO-CLEAR EXPOSURE DOSE FOR THE SWING CURVE

BACKGROUND OF THE INVENTION

A. Field of the Invention

The present invention relates to a method to determine the swing curve which will be used in photolithography of semiconductor technology. More particularly, the present invention relates to a method for determining a dark-to-clear exposure dose in a swing curve.

B. Description of the Related Art

Currently, the integration degree of large-scale integrated circuits is proceeding higher at a speed of a generation per three years. This high integration degree is gradually achieved along with the development of the fine processing technology, especially the technique of photolithography. In the semiconductor process, the main function of the process of photolithography is to define patterns and doping area on individual thin films formed on a semiconductor substrate.

Generally, the process of photolithography for a semiconductor wafer includes the following steps. At first, a photoresist film is coated on the surface of the semiconductor wafer. Next, using a mask with a pattern and an ultraviolet light as an exposing light source, the photoresist film is exposed such that the pattern is transferred from the mask to the photoresist film as a latent pattern. After the exposure, the photoresist film is developed to remove the exposed portion of the photoresist film.

In the process of photolithography, the object of the exposure step is to make the photoresist film absorb appropriate and sufficient exposure dose so as to perform the photochemical transformation. The factors for controlling the exposure dose are the intensity of the exposing light and the time period of the exposure. Furthermore, the magnitude of the exposure dose required to complete the photochemical transformation depends on both the thickness of the exposed photoresist film and the pattern size needed to be transferred.

In the semiconductor process, after the parameters of the process for the etching step is decided and set, it is usually necessary to determine or adjust the thickness of the photoresist film coated on the surface of the thin film. As for the process of photolithography, a swing curve as shown in FIG. 1 is typically adapted for determining the required magnitude of the exposure dose corresponding to a specific thickness of the photoresist film. Referring to FIG. 1, the swing curve is similar to a sine wave and depicted in terms of the magnitude of the exposure dose with respect to the thickness of the photoresist film. The magnitude of the exposure dose decides the degree of the photochemical transformation of the photoresist film. More specifically, the magnitude of the exposure dose is positively proportional to the degree of the photochemical transformation of the photoresist film.

As a method for obtaining the above-mentioned swing curve, a dark-to-clear exposure process has been disclosed. Hereafter, the conventional method will be described in detail with reference to FIGS. 2(A) and 2(B). FIG. 2(A) is a cross-sectional view showing the conventional method for obtaining the above-mentioned swing curve. Referring to FIG. 2(A), at the beginning of the dark-to-clear exposure process, a photoresist film 2 with a given thickness 3 is coated on a silicon dummy wafer 1. Subsequently, using a mask 4 without a pattern, the photoresist film 2 is exposed by means of step and repeat method using an exposing light 5. In other words, the surface of the photoresist film 2 is sectioned to a plurality of rectangular chips and repeatedly exposed from one chip to another. FIG. 2(B) is a plane view showing the photoresist film coated on the silicon dummy wafer shown in FIG. 2(A). Referring to FIG. 2(B), each of the chips 6 is exposed by different magnitudes of the exposure dose. After the completion of exposing all the chips 6, the photoresist film 2 is developed to remove the exposed portions. Next, based on the color appearing due to the light reflected from the surface of the silicon dummy wafer 1, each of the chips 6 is inspected by using human eyes to determine whether the photoresist film 2 coated thereon is completely removed. After the inspection, the magnitude of the exposure dose resulting in the complete removal of the photoresist film 2 is recorded.

Using the same steps as mentioned above, 24 silicon dummy wafers are sequentially exposed. It should be noted that the thicknesses of the photoresist films coated on the 24 silicon dummy wafers are different from each other. By this manner, the swing curve representing the relationship between the thickness of the photoresist film and the magnitude of the exposure dose for completely removing the photoresist film is obtained. However, for the thickness of the photoresist film at the order of $\mu$m, the above-mentioned conventional method using the human eyes to inspect whether the removing of the photoresist is complete or not is very easy to make error. Therefore, it difficult to obtain an accurate swing curve for the $\mu$m order's semiconductor technology.

SUMMARY OF THE INVENTION

In view of the above problem, it is therefore an object of the present invention to provide a method to determine a dark-to-clear exposure dose for a swing curve. By the present invention, it is easy to accurately determine the relationship between the thickness of the photoresist film and the corresponding magnitude of the exposure dose.

The embodiment according to the present invention is to modify the conventional method for determining a dark-to-clear exposure dose in a swing curve by replacing the conventional mask without pattern with that having a critical dimension bar's pattern. Furthermore, the inspection by the human eyes to determine whether the removing is complete is replaced with that performed by a scanning electron microscope. Therefore, an accurate swing curve is obtained for the $\mu$m order's semiconductor technology.

According to the present invention, the method comprises the following steps:

First, photoresist films with different thicknesses are coated on 20 to 40, preferably 25, silicon dummy wafers, respectively. Using a mask with a critical dimension bar's pattern, each of chips of the silicon dummy wafers is exposed by different exposure doses such that the pattern is transferred on each of the chips. After all the silicon dummy wafers are developed, each of the chips of the silicon dummy wafers is inspected by using a scanning electron microscope. For each of the silicon dummy wafers, the exposure dose resulting in completely removing the photoresist film on the region between the adjacent critical dimension bars of the pattern by developing is recorded. In terms of the thickness of the photoresist film as the abscissa and the exposure dose resulting in completely removing the photoresist film on the region between the adjacent critical dimension bars of the pattern as the ordinate, a swing curve is depicted. Finally, the exposure dose corresponding to a peak point or valley point of the swing curve is chosen depending on the subsequent process of etching.

BRIEF DESCRIPTION OF THE DRAWINGS

The objects, features, and advantages of the present invention are clearly understood with reference to the preferred embodiment and the following drawings, wherein.

DETAILED DESCRIPTION OF THE PREFERRED EMBODIMENTS

The preferred embodiment according to the present invention will now be described in detail with reference to FIGS. 1 to 3.

Figure 2A:
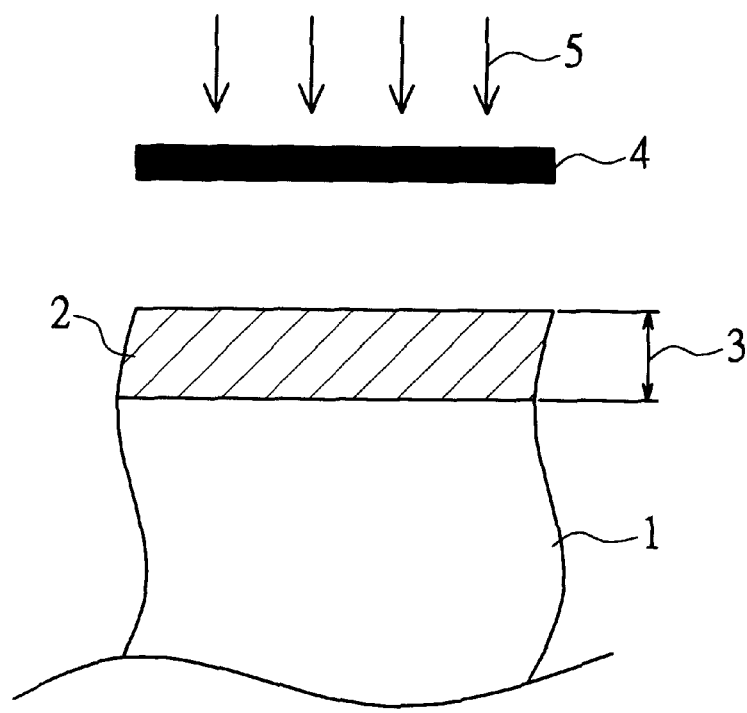
FIG. 2(A) is a cross-sectional view showing the method for determining a dark-to-clear exposure dose in a swing wave according to the present invention.
Figure 2B:
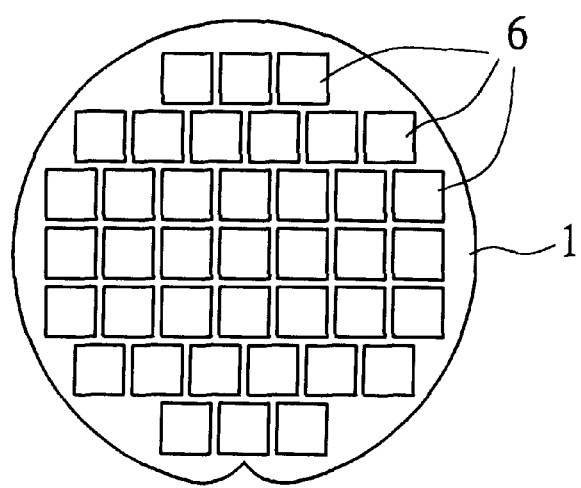
FIG. 2(B) is a plane view showing the method for determining a dark-to-clear exposure dose in a swing wave according to the present invention.
Figure 3:
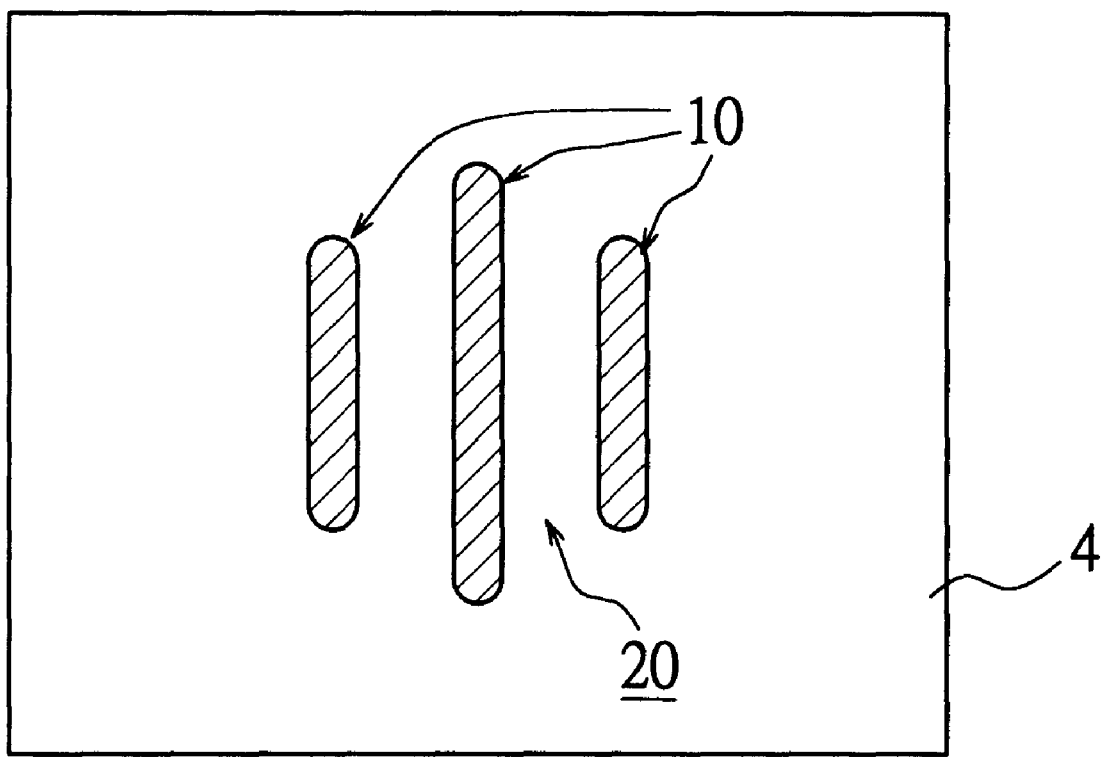
FIG. 3 is a plane view showing a pattern of critical dimension bars on a mask according to the present invention.

Referring to FIG. 2(A), in the beginning, a plurality of photoresist films 2 with different thicknesses 3 are coated on the same number of silicon dummy wafers 1, respectively. In the present embodiment, the number of the silicon dummy wafers is 25. Subsequently, using a mask 4 with a pattern of a plurality of critical dimension bars 10 as shown in FIG. 3, each of the plurality of photoresist films 2 is exposed by means of step and repeat method using an exposing light 5 such as an ultra-violet light, such that the pattern of critical dimension bars 10 is transferred on each of the chips 6. In other words, the surface of each of the photoresist films 2 is sectioned to a plurality of rectangular chips 6 and repeatedly exposed from one chip to another as shown in FIG. 2(B). Referring to FIG. 2(B), each of the chips 6 is exposed by a different exposure dose. Using the same steps, all the 25 silicon dummy wafers are sequentially exposed.

For both the processes of etching and photolithography, the pattern of critical dimension bars 10 is adapted for monitoring whether the parameters of process meet the technical and productive requirements. Therefore, through the above-mentioned manner that each of the chips 6 is exposed at a different exposure dose, the optimum exposure dose corresponding to the thickness 3 of each of the photoresist films 2 is obtained.

After the exposure, the 25 silicon dummy wafers 1 are developed so as to remove the exposed portion of the photoresist films 2. Using a scanning electron microscope (not shown), each of the chips 6 of the silicon dummy wafers 1 is inspected after the treatment of developing. For each of the silicon dummy wafers 1, the exposure dose resulting in completely removing the photoresist film's portion on the region 20 between the adjacent critical dimension bars 10 of the pattern as shown in FIG. 3 by developing is recorded. It is possible to accurately inspect the photoresist film's portion on the region between the adjacent critical dimension bars 10 of the pattern since the resolution of the scanning electron microscope is up to the order of $\mu$m.

In terms of the thickness of the photoresist film as the abscissa and the exposure dose resulting in completely removing the photoresist film on the region between the adjacent critical dimension bars of the pattern as the ordinate, a swing curve is depicted. According to the swing curve showing the experimental records as shown in FIG. 1, the exposure dose required to completely remove the photoresist film varies along with the thickness of the photoresist film as a sine wave. With reference to the swing wave, the exposure dose corresponding to a peak point A or valley point B of the swing curve is chosen depending on the subsequent process of etching.

Figure 1:
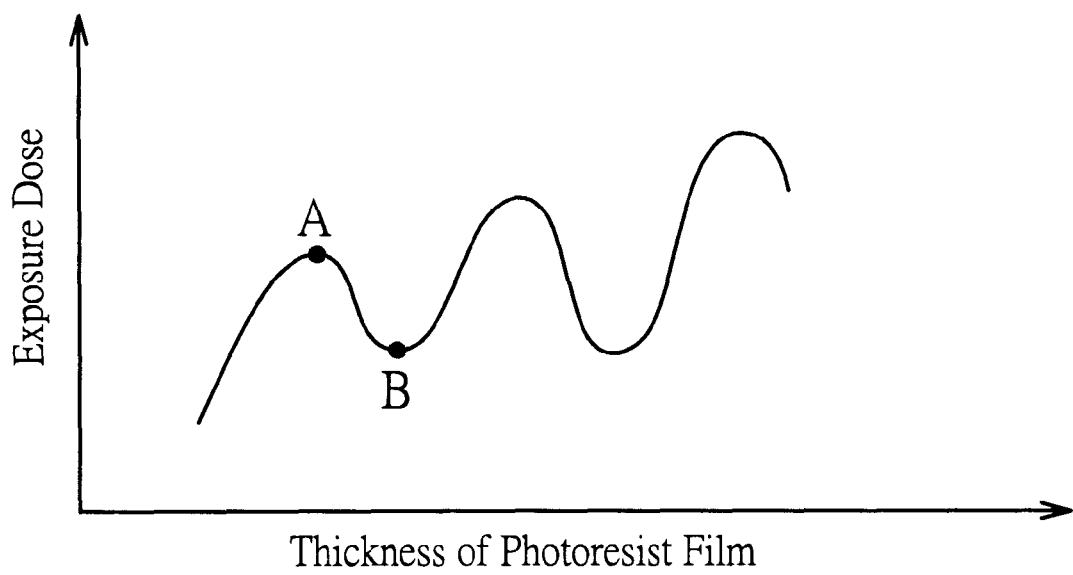
FIG. 1 is a chart showing a swing curve, similar to a sine wave, representing the relationship between the thicknesses of photoresist films and the corresponding exposure doses.

Considering about the peak point A or valley point B of the swing curve as shown in FIG. 1, even though the thickness of the photoresist film changes slightly, the variation of the pattern of critical dimension bars is substantially insignificant because the slope of the tangent at the peak point A or valley point B is zero. As for which section of the swing curve is chosen, it completely depends on the range of the thickness of the photoresist film required for certain processes.

While the invention has been described by way of example and in terms of the preferred embodiment, it is to be understood that the invention is not limited to the disclosed embodiment. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A method for determining a dark-to-clear exposure dose in a swing curve comprising the following steps:

coating photoresist films with different thicknesses on a plurality of dummy wafers, respectively;

performing a dark-to-clear exposure to each chips on said plurality of dummy wafers by using a mask with a pattern of critical dimension bars such that said pattern is transferred on each of said chips;

developing said photoresist films;

inspecting said pattern on each of said chips of said plurality dummy wafers by using an optical instrument;

recording an exposure dose resulting in the complete removing of an exposed part of each of said photoresist films;

depicting a curve in terms of said thicknesses of said photoresist films as the abscissa and said exposure dose resulting in the complete removing of an exposed part of each of said photoresist films as the ordinate; and choosing a point of said curve depending on an object of the subsequent etching process.

2. A method for determining a dark-to-clear exposure dose in a swing curve according to claim 1, wherein said plurality of dummy wafers are silicon wafers.

3. A method for determining a dark-to-clear exposure dose in a swing curve according to claim 1, wherein said optical instrument is a scanning electron microscope.

4. A method for determining a dark-to-clear exposure dose in a swing curve according to claim 1, wherein said point is located at a peak of said curve.

5. A method for determining a dark-to-clear exposure dose in a swing curve according to claim 1, wherein said point is located at a valley of said curve.

6. A method for determining a dark-to-clear exposure dose in a swing curve comprising the following steps:

coating photoresist films with different thicknesses on a plurality of silicon dummy wafers, respectively;

performing a dark-to-clear exposure to each chips on said plurality of silicon dummy wafers by using a mask with a pattern of critical dimension bars such that said pattern is transferred on each of said chips;

developing said photoresist films;

inspecting said pattern on each of said chips of said plurality silicon dummy wafers by using a scanning electron microscope;

recording an exposure dose resulting in the complete removing of an exposed part of each of said photoresist films;

depicting a curve in terms of said thicknesses of said photoresist films as the abscissa and said exposure dose resulting in the complete removing of an exposed part of each of said photoresist films as the ordinate; and choosing a point of said curve depending on an object of the subsequent etching process.

7. A method for determining a dark-to-clear exposure dose in a swing curve according to claim 6, wherein said point is located at a peak of said curve.

8. A method for determining a dark-to-clear exposure dose in a swing curve according to claim 6, wherein said point is located at a valley of said curve.

* * * * *